(12) United States Patent
Parikh

(10) Patent No.: US 10,573,333 B2
(45) Date of Patent: Feb. 25, 2020

(54) REAL TIME DEVICE CUSTOMIZATION APPARATUS AND METHODS OF PERFORMING THE SAME

(71) Applicant: Hand Held Products, Inc., Fort Mill, SC (US)

(72) Inventor: Chirant Parikh, Cedar Rapids, IA (US)

(73) Assignee: HAND HELD PRODUCTS, INC., Fort Mill, SC (US)

( * ) Notice: Subject to any disclaimer, the term of this patent is extended or adjusted under 35 U.S.C. 154(b) by 0 days.

(21) Appl. No.: 15/794,392

(22) Filed: Oct. 26, 2017

(65) Prior Publication Data

US 2019/0130925 A1 May 2, 2019

(51) Int. Cl.
*G06F 17/00* (2019.01)
*G10L 21/0216* (2013.01)
*H05B 33/08* (2020.01)
*G06F 17/14* (2006.01)

(52) U.S. Cl.
CPC ...... *G10L 21/0216* (2013.01); *H05B 33/0854* (2013.01); *G06F 17/142* (2013.01); *G10L 2021/02163* (2013.01)

(58) Field of Classification Search
CPC ......... H04M 1/72569; H04M 1/72577; H04M 2250/12; G05B 19/056; G05B 2219/13022; G06F 8/76
See application file for complete search history.

(56) References Cited

U.S. PATENT DOCUMENTS

| | | |
|---|---|---|
| 8,089,355 B2 | 1/2012 | Aaron |
| 2004/0076305 A1 | 4/2004 | Santiago |
| 2007/0150589 A1 | 6/2007 | Kim et al. |
| 2007/0300054 A1* | 12/2007 | Lo .............................. G06F 8/30 713/2 |
| 2012/0048939 A1 | 3/2012 | Fiutak et al. |

(Continued)

FOREIGN PATENT DOCUMENTS

EP  3001368 A1  3/2016

OTHER PUBLICATIONS

Zhao, Hong et al. "Audio Recording Location Identification Using Acoustic Environment Signature." IEEE Transactions on Information Forensics and Security, vol. 8, No. 11, Nov. 2013, 14 pages.

(Continued)

*Primary Examiner* — Thomas H Maung
(74) *Attorney, Agent, or Firm* — Alston & Bird LLP

(57) ABSTRACT

Provided herein are methods and systems for customizing user devices at the chipset level. Adjustments in BSP-chipset level parameters of the user devices may be performed depending on operating conditions of the user devices. Audio recording samples as well as other sensed conditions may be analyzed to determine a pre-loaded condition which causes self-adjustment of BSP-chipset level parameters of the user device. BSP-chipset level parameters may include any of a screen brightness, LED blinking behavior, LED color, speaker volume, microphone gain, noise cancellation, echo cancellation, battery performance, keypad mapping, touch screen calibration, Wi-Fi profile, WWAN carrier selection, scanner beep volume, the like, and combinations thereof.

25 Claims, 6 Drawing Sheets

(56) References Cited

U.S. PATENT DOCUMENTS

| | | | |
|---|---|---|---|
| 2012/0066696 A1* | 3/2012 | Dasgupta | G06F 15/7807 |
| | | | 719/328 |
| 2015/0121247 A1 | 4/2015 | Zheng | |
| 2015/0281853 A1* | 10/2015 | Eisner | H04R 25/505 |
| | | | 381/312 |
| 2016/0125895 A1 | 5/2016 | Gandhi et al. | |
| 2016/0133245 A1* | 5/2016 | An | G10K 15/08 |
| | | | 381/63 |
| 2016/0188939 A1 | 6/2016 | Sailors et al. | |
| 2016/0203429 A1 | 7/2016 | Mellott et al. | |
| 2018/0225230 A1* | 8/2018 | Litichever | G06F 21/56 |

OTHER PUBLICATIONS

Malik et al. "Acoustic environment identification using unsupervised learning." Security Informatics, a SpringerOpen Journal, 2014 3:11, 17 pages.

* cited by examiner

REAL TIME DEVICE CUSTOMIZATION APPARATUS AND METHODS OF PERFORMING THE SAME

BACKGROUND

User devices may generally be customized to meet the needs of an end user. Typically, such devices are customized based on customer requirements at the original equipment manufacturer and/or by the customer's information technology department, thus requiring significant time and management to configure the devices manually before sending the devices to a user.

Applicant has identified a number of deficiencies and problems associated with conventional methods of customizing user devices and associated systems. Through applied effort, ingenuity, and innovation, many of these identified problems have been solved by developing solutions that are included in embodiments of the present invention, many examples of which are described in detail herein.

SUMMARY

Various embodiments illustrated herein disclose techniques for adjusting BSP-chipset level parameters for user devices, for example, handheld devices, vehicle mounts, portable electronic devices etc. In this regard, in one aspect, an apparatus is configured to adjust BSP-chipset level parameters, in real time, depending on changes in the apparatus or an environment in which the apparatus is located. Illustratively, to identify acoustic environment conditions, the apparatus may comprise a microphone that receives audio recording samples of environment in which the apparatus is located. In this regard, a processor of the apparatus may be configured to access the one or more audio recording samples from the microphone and analyze it to determine a background noise intensity associated with the environment or the apparatus. The determined background noise intensity may then be utilized to determine a pre-loaded condition including a condition indicative of a profile for chipset parameters, such as a chipset operational specification, which drives operations of the chipset. In this regard, when determining the pre-loaded condition, the processor may associate the background noise intensity determined from the audio samples with a pre-loaded condition which may be selected from a set of pre-loaded conditions. Illustratively, the set of pre-loaded conditions may be stored in a database. In this regard, the pre-loaded condition may be such that, upon receiving the one or more audio recording samples, the pre-loaded condition may cause one or more BSP-chipset level parameters of the apparatus to be adjusted. For instance, based on a pre-loaded condition, the apparatus may self-adjust any of its BSP-chipset level parameters such as, screen brightness, LED blinking behavior, battery performance, keypad mapping, or touch screen calibration. Thus, by way of implementation of the aspect described herein, selection and determination of the pre-loaded condition based a current environment identification, like background noise intensity, may cause BSP-chipset level parameters of the apparatus to be self-adjusted.

In some embodiments, the apparatus may cause one or more BSP-chipset level parameters to be adjusted based on the pre-loaded condition by communicating with a chipset to modify the one or more BSP-chipset level parameters. The pre-loaded condition is associated with XML script that can be applied to the BSP-chipset level parameters. The one or more BSP-chipset level parameters may include at least one of the following: screen brightness, LED blinking behavior, LED color, speaker volume, microphone gain, noise cancellation, echo cancellation, battery performance, keypad mapping, touch screen calibration, WiFi profile, WWAN carrier selection, scanner beep volume, the like, or combinations thereof.

In some embodiments, the microphone may be configured to receive audio recording samples by collecting the audio recording samples at pre-defined intervals over a pre-defined period of time. The processor may be in communication with one or more sensors and configured to receive one or more sensed conditions from the one or more sensors by communicating with the one or more sensors. The processor may also be configured to associate the sensed condition with the pre-loaded condition when determining the pre-loaded condition. The one or more sensors may include at least one of the following: accelerometer, scanner, global positioning system, WiFi, Wan, proximity sensor, light sensor, the like, or combinations thereof.

In some embodiments, the processor may be configured to analyze the one or more audio recording samples to determine the background noise intensity by applying a fast fourier transformation (FFT) algorithm or a similar algorithm, the FFT algorithm or similar algorithm resulting in a decibel value representing the background noise intensity.

In some embodiments, the processor may be configured to receive additional audio recording samples of the environment in which the apparatus is located after causing the one or more BSP-chipset level parameters to be adjusted; analyze the additional audio recording samples to determine a second background noise intensity; determine a second pre-loaded condition by associating the second background noise intensity with the second pre-loaded condition selected from the set of pre-loaded conditions stored in the database; and cause the same or different one or more BSP-chipset level parameters to be adjusted based on the second pre-loaded condition in response to receiving the additional audio recording samples.

The processor may be configured to receive the additional audio recording samples after a pre-defined period of time has passed since the processor caused the one or more BSP-chipset level parameters to be adjusted based on the pre-loaded condition by monitoring a time delay after the one or more BSP-chipset level parameters.

In some embodiments, the BSP-chipset level parameter may be the noise cancellation parameter and the noise cancellation parameter may be adjusted when the background noise intensity is determined to be outside a threshold level associated with the pre-loaded condition. In some embodiments, the BSP-chipset level parameter may be the LED blinking behavior parameter and the LED blinking behavior parameter may be adjusted when the one or more sensed conditions indicate the apparatus is in motion.

In some embodiments, the processor may be configured to calibrate the microphone to collect background noise by collecting audio recording samples in an environment with a low background noise intensity.

In another aspect, a method of adjusting BSP-chipset level parameters of a device, in real time in response to changes in an environment is described. Illustratively, the changes in environment herein may correspond to changes in an environment where the device is utilized or operated, or alternatively, may also correspond to changes in the device's internal environment. For instance, the method may include receiving one or more audio samples recorded via a microphone located in the environment. The one of more audio recording samples recorded may then be analyzed to determine a background noise intensity. The method further may include determining a pre-loaded condition based on the determined background noise intensity. In this regard, the determination of the pre-loaded condition may be based on associating the background noise intensity with the pre-loaded condition. Illustratively, the pre-loaded condition may be one selected from a set of pre-loaded conditions stored in a database. In this regard, the pre-loaded condition may be such that, it causes one or more BSP-chipset level parameters to be adjusted in response to receiving the one or more audio recording samples. For instance, in an example implementation of the illustrated aspect, adjustments in any of the chipset parameters like screen brightness, LED blinking behavior, battery performance, keypad mapping, or touch screen calibration may be performed.

In some embodiments, the method may include adjusting the one or more BSP-chipset level parameters based on the pre-loaded condition by communicating with a chipset to modify the one or more BSP-chipset level parameters. The pre-loaded condition is associated with an XML script on the application layer that can then be applied to the respective BSP-chipset level parameter. The flow of data happens in one direction, from XML to the chipset (e.g., application layer to the framework/OS layer to HAL to hardware modules). The one or more BSP-chipset level parameters may include at least one of the following: screen brightness, LED blinking behavior, LED color, speaker volume, microphone gain, noise cancellation, echo cancellation, battery performance, keypad mapping, touch screen calibration, WiFi profile, WWAN carrier selection, or scanner beep volume.

In some embodiments, when receiving one or more audio recording samples from the microphone, the method may include receiving audio recording samples at pre-defined intervals over a pre-defined period of time. The method may include receiving one or more sensed conditions from one or more sensors by communicating with the one or more sensors. The method may include associating the one or more sensed conditions with the pre-loaded condition when determining the pre-loaded condition. The one or more sensors may include at least one of the following: microphone, accelerometer, gyroscope, scanner, global positioning system, WiFi, Wan, proximity sensor, ambient light sensor, digital compass, the like, or combinations thereof.

In some embodiments, when analyzing the one or more audio recording samples to determine the background noise intensity, the method may include applying a fast fourier transformation (FFT) algorithm or a similar algorithm, the FFT algorithm or similar algorithm resulting in a decibel value representing the background noise intensity.

In some embodiments, the method may further include receiving additional audio recording samples after causing the one or more BSP-chipset level parameters to be adjusted; analyzing the additional audio recording samples to determine a second background noise intensity; determining a second pre-loaded condition by associating the second background noise intensity with the second pre-loaded condition selected from the set of pre-loaded conditions stored in the database; and causing the same or different one or more BSP-chipset level parameters to be adjusted based on the second pre-loaded condition in response to receiving the additional audio recording samples. In some embodiments, receiving the additional audio recording samples may occur after a pre-defined period of time has passed since causing the one or more BSP-chipset level parameters to be adjusted based on the pre-loaded condition.

In some embodiments, the BSP-chipset level parameter may be the noise cancellation parameter and the noise cancellation parameter may be adjusted when the background noise intensity is determined to be outside a threshold level associated with the pre-loaded condition.

In some embodiments, the BSP-chipset level parameter may be the LED blinking behavior parameter and the LED blinking behavior parameter may be adjusted when the one or more sensed conditions indicate the apparatus is in motion.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

The accompanying drawings illustrate embodiments of the invention, and, together with the specification, including the general description above and the detailed description which follows, serve to explain the features of the present invention.

DETAILED DESCRIPTION

Figure 1:
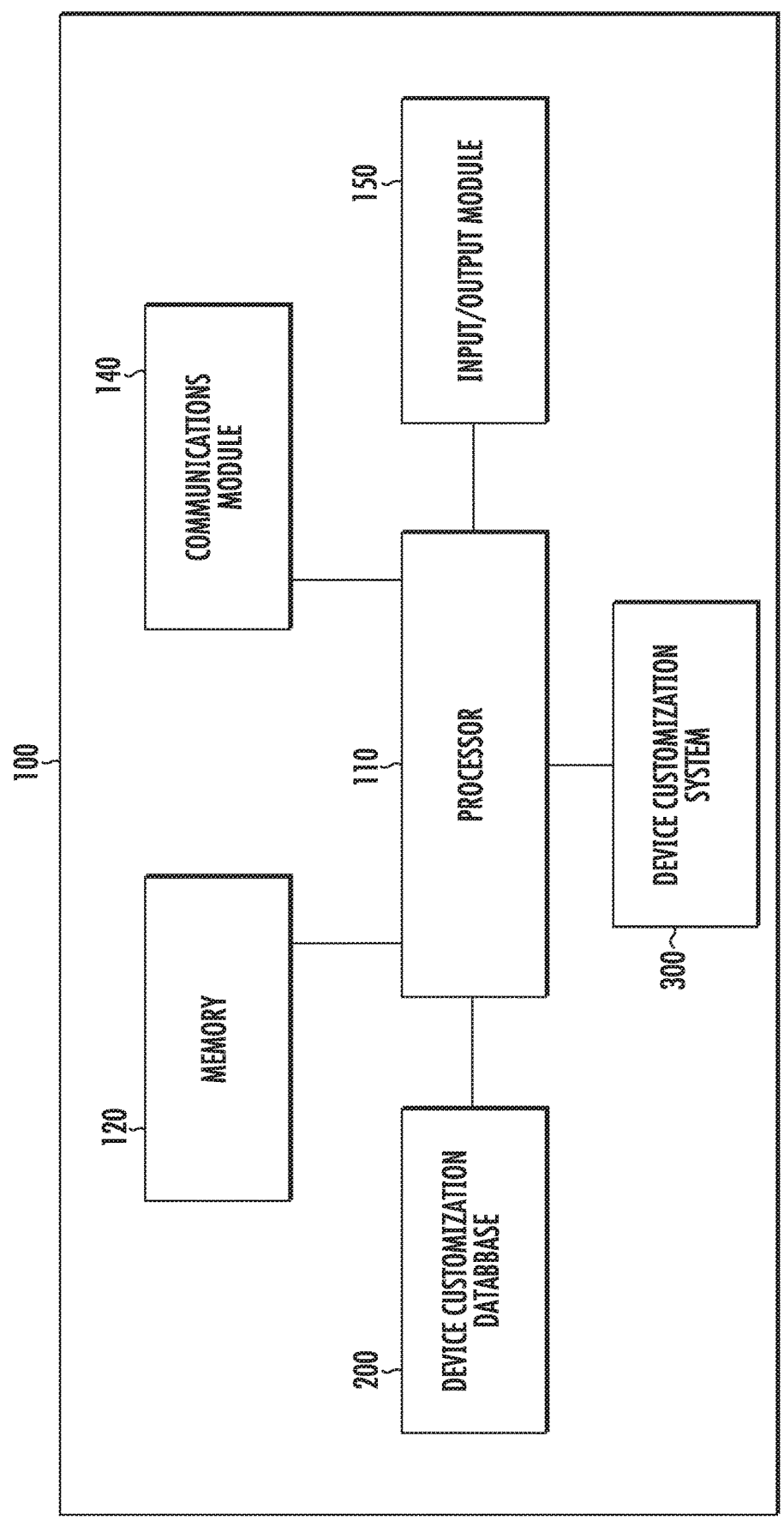
FIG. 1 illustrates a schematic block diagram of a real-time device customization system according to an example embodiment.

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," "outside," "inside," etc. are used for explanatory purposes in the examples provided below to describe the relative position of certain devices or portions of devices. Terminology used in this patent is not meant to be limiting insofar as devices described herein, or portions thereof, may be attached or utilized in other orientations.

The term "comprising" means including but not limited to, and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment).

The word "exemplary" is used herein to mean "serving as an example, instance, or illustration." Any implementation described herein as "exemplary" is not necessarily to be construed as preferred or advantageous over other implementations.

The terms "about" or "approximately" or the like, when used with a number, may mean that specific number, or alternatively, a range in proximity to the specific number, as understood by persons of skill in the art field.

If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

As used herein, the term "transmitter" refers to any component that can generate radio waves for communication purposes while a "receiver" is used to generally refer to any component that can receive radio waves and convert the information into useable form. A "transceiver" generally refers to a component that can both generate radio waves and receive radio waves and is thus contemplated when either a transmitter or a receiver is discussed.

The term "processor" is used herein to refer to any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Software applications may be stored in the internal memory before they are accessed and loaded into the processors. The processors may include internal memory sufficient to store the application software instructions. In many devices the internal memory may be a volatile or nonvolatile memory, such as flash memory, or a mixture of both. The memory can also be located internal to another computing resource (e.g., enabling computer readable instructions to be downloaded over the Internet or another wired or wireless connection).

For the purposes of this description, a general reference to "memory" refers to memory accessible by the processors including internal memory or removable memory plugged into the device and memory within the processors themselves. For instance, memory may be any non-transitory computer readable medium having computer readable instructions (e.g., computer program instructions) stored thereof that are executable by a processor.

The term "computing device" is used herein to refer to any one or all of programmable logic controllers (PLCs), programmable automation controllers (PACs), industrial computers, desktop computers, personal data assistants (PDAs), laptop computers, tablet computers, smart books, palm-top computers, personal computers, smartphone, smartwatch, and similar electronic devices equipped with at least a processor configured to perform the various operations described herein. Devices such as smartphones, tablets, and smartwatches are generally collectively referred to as mobile devices. In some embodiments, the user device or apparatus is a mobile device that is a computing device in communication with multiple sensors and capable of processing sensed conditions received from the sensors.

The term "server" is used to refer to any computing device capable of functioning as a server, such as a master exchange server, web server, mail server, document server, or any other type of server. A server may be a dedicated computing device or a computing device including a server module (e.g., running an application which may cause the computing device to operate as a server). A server module (e.g., server application) may be a full function server module, or a light or secondary server module (e.g., light or secondary server application) that is configured to provide synchronization services among the dynamic databases on computing devices. A light server or secondary server may be a slimmed-down version of server type functionality that can be implemented on a computing device, such as a smart phone, thereby enabling it to function as an Internet server (e.g., an enterprise e-mail server) only to the extent necessary to provide the functionality described herein.

The term "BSP-chipset level parameters" are used to refer to any operational parameters associated with at least one of a hardware unit or chipset in a user device through the board support package ("BSP"). The BSP-chipset level parameters may have a broader range than typically accessible on the user interface and/or may not be typically accessible on the user interface. The parameters are generally too technical to allow access on the user interface by a general end user and any changes in these parameters may impact regulatory results, thus, the parameters are not generally accessible on the user interface. Illustratively, but not limited to the chipset may be a processor or a microprocessor chipset in the user device, such as Qualcomm, Intel, etc. Additionally, but not limited to, the chipset may be a chipset of a controller or hardware unit corresponding to any of a motherboard, memory, microphone, network interface card (NIC), speakers, keypad, display screen, an image scanner, LEDs, optical coded information reader, indicia reader etc. Such BSP-chipset level parameters specific for a chipset are accessible via interpretation or processing, of software code, like a board support package, containing hardware specific drivers and other routines which drives operation for the chipset. In this regard, the BSP acts as an interface or a layer baked between the OS over the hardware unit, usually supports an operating system on a user device to function in a particular hardware environment. In addition, the BSP-chipset level parameters, also referred herein, interchangeably as 'system level parameters' may be indicative of, but not limited to, modes of operation or threshold that influence operations, functions, or performance associated with any of the chipset(s) described above. In addition, the BSP-chipset level parameters described herein may correspond to, but not limited to, one or more of screen brightness, LED blinking behavior, LED color, speaker volume, microphone gain, noise cancellation, echo cancellation, battery performance, keypad mapping (e.g., what each key does), touch screen calibration, Wi-Fi profile, WWAN carrier selection, or scanner beep volume. The chipset may be a screen brightness modular chipset, LED modular chipset, audio modular chipset, microphone modular chipset, battery modular chipset, keypad modular chipset, touch screen modular chipset, Wi-Fi modular chipset, WWAN modular chipset, scanner modular chipset, the like, and combinations thereof.

Overview

User devices need customization as the user devices are deployed or utilized in an environment or field of application. Such customization may depend on the environment in which the user device is operating, also referred as an "operating environment" for the user device. For instance, in some environments, there may be a significant amount of background noise which needs to be filtered out and considered while generating output from the user devices to achieve smooth operational performance of the user devices. In some cases, operating environment conditions may require a hardware level change, e.g., hardware level noise cancellation at the user device end. In this regard, simply modifying operating parameters located at the application level on the user devices may not suffice. One may need to modify BSP-chipset level or system level parameters. In this regard, the BSP-chipset level parameters may define modes or thresholds that influence operations of a chipset like a processor chipset, or a hardware chipset unit of any component on these user devices. For instance, in handheld devices, these system level parameters may be like a maximum gain set for speakers of the handheld device, modification in a speaker beep volume, or a microphone sensitivity threshold.

However, modifying BSP-chipset level parameters is cumbersome, requires manual intervention, and involves overhead cost and time. Usually, such modifications at the chipset level is challenging, firstly, as it requires access to source code, such as a chipset embedded code, commonly known as, board support package (BSP), of the chipset which is not readily accessible, unless a manufacturing unit purchases or licenses it from an OEM, and secondly, it requires expertise from a device maintenance support department at the manufacturer's end or by similar support units from a distributor level to perform such customization. This leads to lack of scalability in customization, higher device maintenance costs, higher time and resource consumption at a manufacturer or distributor end and thereby further, leading to unsatisfactory end customer experience in operating these devices. The BSP-chipset level parameters are generally too technical to allow access on the user interface by a general end user and any changes in these parameters may impact regulatory results, thus, the parameters are not generally accessible on the user interface.

Portable electronic devices or handheld devices, are commonly used in various fields for performing tasks for increasing productivity or for streamlining operations in a workflow. For instance, devices like personal digital assistants, POS machines, scanners, RFID readers, assistive handheld devices, etc. are commonly used in various field of operations, such as in logistics, warehouse or inventory management. Environmental conditions, where these devices are operated plays a key role in operational performance, both hardware and software related, for these devices. For instance, often such handheld devices are commonly used in airports for assisting airport staff at various locations, like baggage collection point, ticket purchasing point of sale (POS) etc. In such places, there may be a lot of background noise and thus, customization may be needed for use of the handheld devices. For instance, a customization such as of a maximum gain set for speakers of the handheld devices used in such noise environment may be required. Similarly, in another environment where these user devices are deployed or utilized, like logistics or warehouses, it may so happen that for efficient functioning of the handheld devices, hardware noise cancellation of the device itself may be required when capturing an operator's command via a microphone of the device. This may again require some customization, after the hardware chipset has been purchased from the Original Equipment Manufacturer (OEM) and during utilization of the device in the environment, at a chipset level for achieving maximum performance efficiency. Thus, there may be frequent requirements of performing customization of the devices at customer's end.

Customizing, such user devices which involve modifications or changes at the system level are referred to herein as "BSP-chipset level" i.e. customization in parameters, modes or thresholds associated with operational behavior of a chipset of the user devices through the BSP. Such modification is typically either not available or challenging and requires additional maintenance cost, resources, and time. In this regard, in handheld devices, these BSP-chipset level parameters may be e.g., maximum gain set for speakers of the handheld device, modification in a speaker beep volume, microphone sensitivity threshold, or alternatively, may be any other BSP-chipset level parameter, such as others described herein. Customizing such parameters require processing chipset specification data from the board support package at a binary byte code level, which again is not easily accessible and challenging as described previously. Obviously, need of such customization requirements, increases multifold, when the user devices such as, PDT, or handheld devices are concerned, as these devices are utilized in various fields of applications with different operating environments. Further, such customization is time and resource consuming as it also involves processing and preparing data files with modified BSP-chipset level parameters plumed into such data files every time there is a requirement from a customer or an end consumer. At times, various product manufacturers or IT solution providers may have dedicated maintenance and support teams with trained personnel which may provide some customization as dedicated services, however, this leads to overhead cost to the OEM or a device manufacturer which purchases such chipset from the OEM providers. Accordingly, performing such modifications of BSP-chipset level parameters of these devices is either not available or cumbersome, requires manual intervention, and involves additional overhead cost and time.

Various embodiments described herein, illustrates techniques for adjusting or modifying BSP-chipset level parameters of user devices like portable electronic devices (PDAs), depending on the operating environment in which such user devices are located. Devices and operations for adjusting BSP-chipset level parameters in real time is provided herein. According to various aspects, the apparatus, in response to detecting changes in the apparatus or an environment in which the apparatus is located, provides for adjusting the BSP-chipset level parameters associated with the apparatus.

Illustratively, the BSP-chipset level parameters may include, for example, screen brightness, LED blinking behavior, LED color, speaker volume, microphone gain, noise cancellation, echo cancellation, VOIP behavior, WAN audio customized, battery performance, keypad mapping, touch screen calibration, Wi-Fi profile, WWAN carrier selection, or scanner beep volume, etc. or any other BSP-chipset level parameters associated with a user device, such as a PDT, a handheld or a portable electronic device.

In accordance with various embodiments described herein, the apparatus may adjust BSP-chipset level parameters depending on various factors associated with an environment. The factors associated with an environment may form a profile or identity of the environment. In one aspect, according to various embodiments disclosed herein, identification of such environment conditions such as, through acoustic environmental identification, may be based on analyzing audio samples collected by a microphone of the apparatus. In this regard, the audio samples may be analyzed to determine a background noise intensity which is thereafter utilized by a processor of the apparatus to determine a pre-loaded condition. Illustratively, the background noise intensity may be indicative of a noise associated with, for example, a sound pressure or an acoustic intensity value in an environment. In some embodiments, other sensed conditions may be used to determine the environment and select a pre-loaded condition. The pre-loaded conditions, in this regard, may comprise one or more values which define a profile of a chipset specification. Based on the pre-loaded condition, the BSP-chipset level parameters of the apparatus may be modified. Illustratively, there may be multiple pre-loaded conditions stored in a database and the identified pre-loaded condition may be selected from amongst the set of pre-loaded conditions depending on an association or mapping of the background noise intensity with the multiple pre-loaded conditions available in the database.

Illustratively, several pre-loaded conditions may be stored in a database which may cause one or more BSP-chipset level parameters of the user device to be adjusted. In this regard, the pre-loaded conditions may correspond to pre-created chipset configuration profiles having chipset specification/parameters defined based on various conditions. Such profiles may include chipset parameter data plumed into XML files based on different operating conditions, which may be used for adjusting BSP-chipset level parameters of corresponding chipsets in user devices. These profiles may be pre-created either by an OEM or by a device manufacturer, depending on profiles or identities of all working environments where such user devices are to be utilized for which a customer provides the requirements while purchasing the user device. For instance, one such requirement indicating an environment profile may be a background noise intensity. Accordingly, based on the determined pre-loaded condition, the BSP-chipset level parameters of the user device may be adjusted in real-time whenever a customer deploys or utilize such user devices in different environments.

Accordingly, by way of implementation of various embodiments illustrated herein, infrastructure and management burden for configuring each user device manually depending on an operating environment may be reduced. Further, by determination of an environment type, i.e. by including determination of background noise intensity, by performing environmental acoustic identification, and/or obtaining other sensed conditions of the environment, overall cost and time to be invested for customization of various user devices post shipping of the user device at a customer's site may be reduced. Additionally, in such situations, device manufacturers may directly purchase OEM manufactured chipsets and customize the chipsets at their own end based on operational conditions or environment requirements at which the devices are deployed from end customers. This provides a win-win situation for device manufacturers, OEM providers and end-customers purchasing such user devices. In this regard, the customers experience flexibility for customizing their user devices at a chipset or system level depending on operating environment, whereas, on other hand, the OEMs gains in reducing maintenance and IT support services cost required post selling of the user devices to the customers.

Having described example embodiments at a high level, the design of the various devices performing various example operations is provided below.

System Architecture

The components illustrated in the figures represent components that may or may not be present in various embodiments of the invention described herein such that embodiments may include fewer or more components than those shown in the figures while not departing from the scope of the invention.

The present disclosure provides device customization systems suitable for use in various environments, such as in a warehouse, retail store, office building, delivery truck, airport, etc. Such environments may correspond to places or operating conditions in which user devices are to be operated or utilized. The operating conditions may be such that the performance or operating behavior of the user devices may be affected. Customization may therefore be needed depending on the operating conditions. The present disclosure may be particularly beneficial when it is desired to adjust chipset level settings on devices per the particular use of the device.

A user device may be implemented as a computing device, such as a personal computer, a personal digital assistant (PDA), and/or other networked device, such as a cellular phone, tablet computer, mobile device, point of sale terminal, inventory management terminals, indicia reading devices like barcode scanners, RFID reading devices, Near-field communication (NFC) based devices, printers, voice based assistants, etc., which may be used for any suitable purpose. In one embodiment, the user device may be configured to display an interface on a display of the user device for viewing, creating, editing, and/or otherwise interacting with another device or the user.

FIG. 1 shows a schematic block diagram of circuitry 100, some or all of which may be included in, for example, one or more user devices. Any of the aforementioned systems or devices may include the circuitry 100 and may be configured to, either independently or jointly with other devices in a network, perform the functions of the circuitry 100 described herein. In accordance with various embodiments described herein, the circuitry 100 of the user device may be configured to execute the operations described below in connection with FIGS. 5 and 6. As illustrated in FIG. 1, in accordance with some example embodiments, circuitry 100 can include various means, such as processor 110, memory 120, communications module 140, and/or input/output module 150. In this regard, each of the processor 110, memory 120, communications module 140, and/or input/module may have one or more respective chipsets or hardware units. Such chipsets may operate based on a chipset specification, including parameters or operating conditions, also referred herein as BSP-chipset level parameters, throughout the description. In this regard, as described previously, the BSP-chipset level parameters may be accessible via interpretation or processing, of software code, like a Board support package (BSP), containing hardware specific drivers and other routines which drives operation for such chipsets. Additionally, the BSP-chipset level parameters may be indicative of, but not limited to, modes of operation, threshold values or any other parameter that influence operations, functions, or performance associated with any of such chipsets.

In some embodiments, device customization database 200 and/or device customization system 300 may also or instead be included. In this regard, the device customization database 200 may be configured to store various customization profiles, also referred herein as pre-loaded conditions. The pre-loaded conditions or customization profiles may be such that, selection and execution of the selected pre-loaded condition by the processor 110 and/or device customization system 300 causes adjustment in BSP-chipset level parameters for any of the chipset in the circuitry 100 of the user devices. As referred to herein, "module" includes hardware, software and/or firmware configured to perform one or more particular functions. In this regard, the means of circuitry 100 as described herein may be embodied as, for example, circuitry, hardware elements (e.g., a suitably programmed processor, combinational logic circuit, and/or the like), a computer program product comprising computer-readable program instructions stored on a non-transitory computer-readable medium (e.g., memory 120) that is executable by a suitably configured processing device (e.g., processor 110), or some combination thereof.

Processor 110 may, for example, be embodied as various means including one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an ASIC (application specific integrated circuit) or FPGA (field programmable gate array), or some combination thereof. Accordingly, although illustrated in FIG. 1 as a single processor, in some embodiments processor 110 comprises a plurality of processors. The plurality of processors may be embodied on a single computing device or may be distributed across a plurality of computing devices collectively configured to function as circuitry 100. The plurality of processors may be in operative communication with each other and may be collectively configured to perform one or more functionalities of circuitry 100 as described herein. In an example embodiment, processor 110 is configured to execute instructions stored in memory 120 or otherwise accessible to processor 110. These instructions, when executed by processor 110, may cause circuitry 100 to perform one or more of the functionalities of circuitry 100 as described herein.

Whether configured by hardware, firmware/software methods, or by a combination thereof, processor 110 may comprise an entity capable of performing operations according to embodiments of the present invention while configured accordingly. Thus, for example, when processor 110 is embodied as an ASIC, FPGA or the like, processor 110 may comprise specifically configured hardware for conducting one or more operations described herein. Alternatively, as another example, when processor 110 is embodied as an executor of instructions, such as may be stored in memory 120, the instructions may specifically configure processor 110 to perform one or more algorithms and operations described herein, such as those discussed in connection with FIGS. 1-6.

Memory 120 may comprise, for example, volatile memory, non-volatile memory, or some combination thereof. Although illustrated in FIG. 1 as a single memory, memory 120 may comprise a plurality of memory components. The plurality of memory components may be embodied on a single computing device or distributed across a plurality of computing devices. In various embodiments, memory 120 may comprise, for example, a hard disk, random access memory, cache memory, read only memory (ROM), erasable programmable read-only memory (EPROM) & electrically erasable programmable read-only memory (EEPROM), flash memory, magnetic cassettes, magnetic tape, magnetic disk storage or other magnetic storage devices, a compact disc read only memory (CD-ROM), digital versatile disc read only memory (DVD-ROM), an optical disc, circuitry configured to store information, or some combination thereof. Memory 120 may be configured to store information, data (including item data and/or profile data), applications, instructions, or the like for enabling circuitry 100 to carry out various functions in accordance with example embodiments of the present invention. For example, in at least some embodiments, memory 120 is configured to buffer input data for processing by processor 110. Additionally, or alternatively, in at least some embodiments, memory 120 is configured to store program instructions for execution by processor 110. Memory 120 may store information in the form of static and/or dynamic information. This stored information may be stored and/or used by circuitry 100 during the course of performing its functionalities. Illustratively, in some embodiments, the memory 120 may be configured to store various customization profiles, also referred to herein as pre-loaded conditions. The pre-loaded conditions may be such that, selection and execution of the selected pre-loaded condition by the processor 110 and/or device customization system 300 causes adjustment in BSP-chipset level parameters, for any of the chipset in the circuitry 100 of the user devices. In another embodiment, such customization profiles or pre-loaded conditions may be collectively and/or in a distributive manner, stored in the memory 120 and/or the device customization database 200. In such situations, the processor 110 and/or device customization system 300 may access the pre-loaded conditions from any of the memory 120 or the device customization database 200. Illustratively, in an example, access of the pre-loaded conditions or the customization profiles by the processor 110 and/or device customization system 300 may be performed based on a rule set. In this regard, the rule set may be defined for accessing the customization profiles from either the memory 120 or the device customization database 200. For instance, in an example implementation of the illustrated embodiment, the rule set may correspond to a size of the pre-loaded condition which may cause storage of the pre-loaded conditions in either of the customization database 200 or the memory 120. For example, pre-loaded conditions which includes chipset configuration files of larger size may be stored in the device customization database 200 whereas ones which are smaller in size may be stored in the memory 120. The pre-loaded conditions may be stored on a cloud server, SD card, and various other storage mediums and can be applied to the device.

Accordingly, in such situation, the processor 110 and/or device customization system 300 may identify based on the rule set, from where to access the customization profile or the pre-loaded condition that may include a chipset configuration applicable for a particular environment in which the user device is required to be operated.

Communications module 140 may be embodied as any device or means embodied in circuitry, hardware, a computer program product comprising computer readable program instructions stored on a computer readable medium (e.g., memory 120) and executed by a processing device (e.g., processor 110), or a combination thereof that is configured to receive and/or transmit data from/to another device and/or network, such as, for example, a second circuitry 100 and/or the like. In some embodiments, communications module 140 (like other components discussed herein) can be at least partially embodied as or otherwise controlled by processor 110. In this regard, communications module 140 may be in communication with processor 110, such as via a bus. Communications module 140 may include, for example, an antenna, a transmitter, a receiver, a transceiver, network interface card and/or supporting hardware and/or firmware/software for enabling communications with another computing device. Communications module 140 may be configured to receive and/or transmit any data that may be stored by memory 120 using any protocol that may be used for communications between computing devices. Communications module 140 may additionally or alternatively be in communication with the memory 120, input/output module 150 and/or any other component of circuitry 100, such as via a bus.

Input/output module 150 may be in communication with processor 110 to receive an indication of a user input and/or to provide an audible, visual, mechanical, or other output to a user (e.g., employee and/or customer). Some example visual outputs that may be provided to a user by circuitry 100 are discussed in connection with FIGS. 1-6 As such, input/output module 150 may include support, for example, for a keyboard, a mouse, a joystick, a display, a touch screen display, a microphone, a speaker, a RFID reader, barcode reader, biometric scanner, and/or other input/output mechanisms. In embodiments, wherein circuitry 100 is embodied as a server or database, aspects of input/output module 150 may be reduced as compared to embodiments where circuitry 100 is implemented as an end-user machine (e.g., remote worker device and/or employee device) or other type of device designed for complex user interactions. In some embodiments (like other components discussed herein), input/output module 150 may even be eliminated from circuitry 100. Alternatively, such as in embodiments wherein circuitry 100 is embodied as a server or database, at least some aspects of input/output module 150 may be embodied on an apparatus used by a user that is in communication with circuitry 100. Input/output module 150 may be in communication with the memory 120, communications module 140, and/or any other component(s), such as via a bus. One or more than one input/output module and/or other components can be included in circuitry 100.

The device customization database 200 and the device customization system 300 may also or instead be included and configured to perform the functionality discussed herein related to device customization. In some embodiments, some or all of the functionality of customizing the device may be performed by processor 110. In this regard, the example techniques pertaining to customization of devices, for instance, including those of adjustment in BSP-chipset level parameters discussed herein can be performed by at least one processor 110, device customization database 200, and/or device customization system 300. Illustratively, non-transitory computer readable media can be configured to store firmware, one or more application programs, and/or other software, which include instructions and other computer-readable program code portions that can be executed to control each processor (e.g., processor 110, device customization database 200, and/or device customization system 300) of the components of circuitry 100 to implement various operations, including the examples shown above. As such, a series of computer-readable program code portions are embodied in one or more computer program goods and can be used, with a computing device, server, and/or other programmable apparatus, to produce machine-implemented processes.

Figure 2:
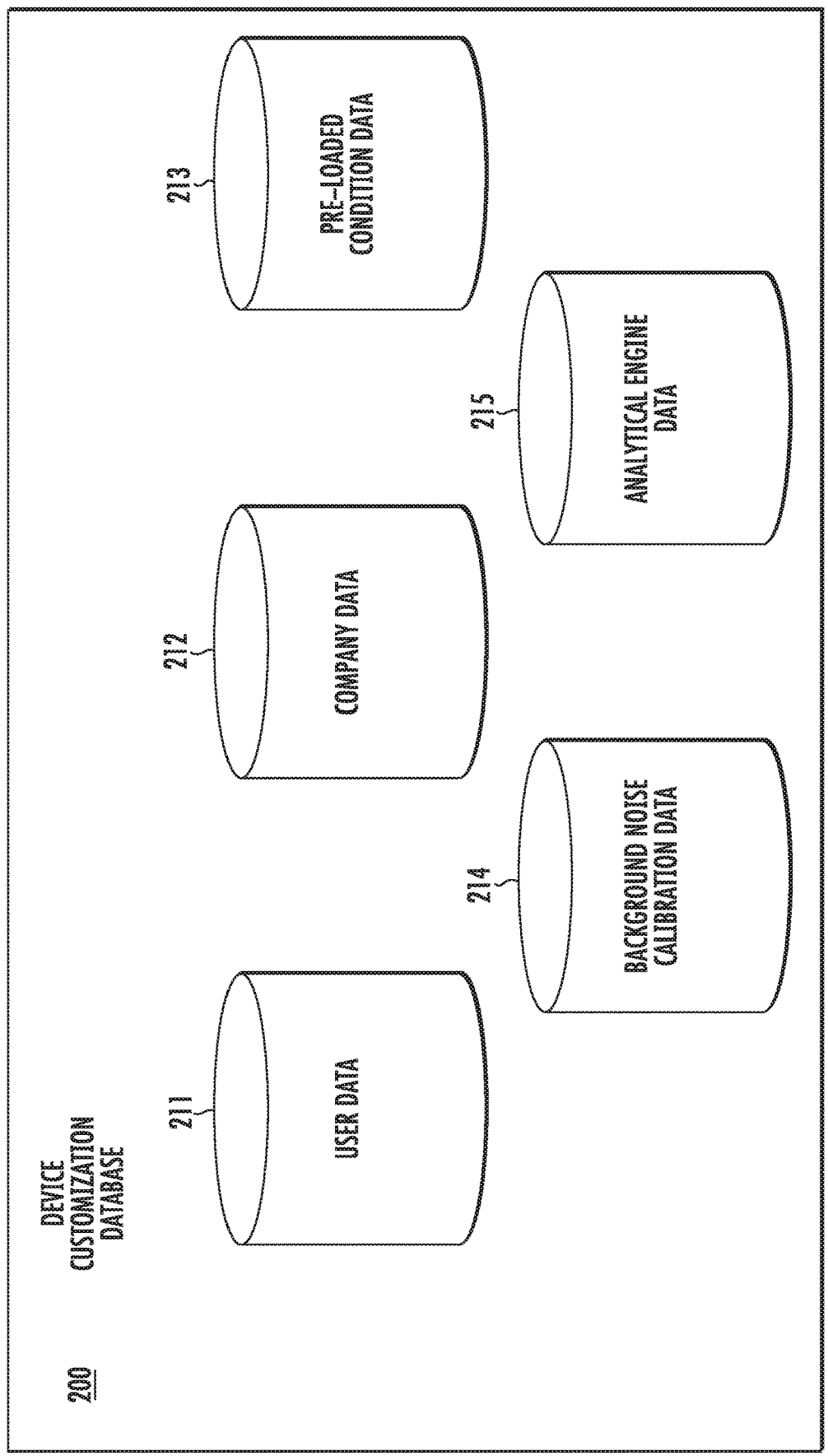
FIG. 2 illustrates a schematic block diagram of a device customization database according to an example embodiment.

In some embodiments, a device customization database 200 may be provided that includes various relevant information for device customization. In this regard, the device customization database 200 may be configured to store data, such as various pre-loaded customization profiles or pre-loaded conditions that may be utilized while executing the operations described below in connection with FIGS. 5 and 6. Various other data may be included in the device customization database 200. For instance, as shown in FIG. 2, in this embodiment, the device customization database 200 includes user data 211, company data 212, pre-loaded condition data 213, and background noise calibration data 214. As additional sensed conditions are received and audio recording samples are received, the system 100 may store this information in the device customization database 200. In this regard, the additional sensed conditions may correspond to one or more of a data received, via any of a global positioning system (GPS), a scanner device, a light sensor, a Wi-fi module, and a WLAN module etc. and stored at the device customization database 200. In addition, as additional information is developed regarding pre-loaded conditions, the user device may receive this additional information and store the information in the device customization database 200 for future use. Additionally, or alternatively, the device customization database 200 may include analytical engine data 215 which provides any additional information needed by the device customization system 300 in analyzing inputs and generating the appropriate response.

For example, device customization system 300 can be configured to analyze multiple sets of data (e.g., including various combinations of user data 211, company data 212, pre-loaded condition data 213, background noise calibration data 214, etc.), such as the data in the device customization database 200. In this way, device customization system 300 may support multiple operations, including those discussed below with respect to user data 211, company data 212, pre-loaded condition data 213, background noise calibration data 214, etc., so that the selected operation may be chosen at runtime. In this regard, the device customization 300 may be configured to perform methods described with reference to FIGS. 5 and 6. Further, the present configuration can enable flexibility in terms of configuring additional contexts.

Figure 3:
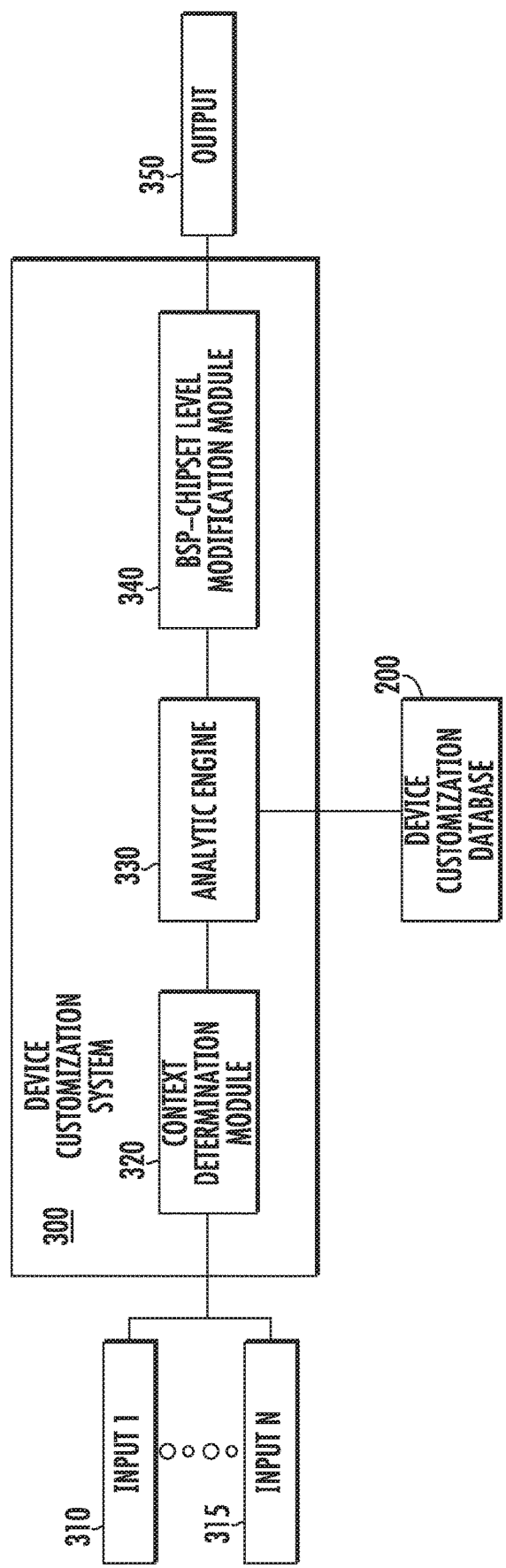
FIG. 3 illustrates a schematic block diagram of a device customization system according to an example embodiment.

In some embodiments, with reference to FIG. 3, the device customization system 300 may include a context determination module 320, analytical engine 330, and BSP-chipset level modification module 340, all of which may be in communication with the device customization database 200. The device customization system 300 may receive one or more inputs (e.g., sensed conditions and/or audio recording samples) input 310, input 315 . . . input N and may generate an appropriate output (i.e., response) 350. In this regard, according to various embodiments illustrated herein, the device customization system 300 may receive inputs 310-input N indicative of operating conditions of an environment in which the apparatus may be operated. Illustratively, the inputs may be pertaining to any of acoustic conditions, such as background noise, device hardware noise, or speech or sound intensity present in the environment; location values received via a GPS unit; indicia scanned by indicia reading terminal; Wi-fi network profile, or any other condition sensed by user device. In this regard, the inputs 310, 315 . . . input N may correspond to additional sensed conditions such as inputs from various components of the user device itself. Illustratively, one or more components of the user device such as, GPS, accelerometer, Wi-fi card, indicia reading terminal, proximity sensor, or any other sensors etc., may provide various inputs. For instance, the inputs 310, 315 . . . input N may correspond to any data indicative of an operating condition of at least one of the user device or the environment in which the user device is located. For example, the inputs may correspond to a location of the user device; an indication that the user device is in motion or steady; an indication if the user device is connected to a same Wi-fi network or another Wi-fi network; an indication if the user device is operating in a handset, speaker or a wired headset mode; or an indication if a scanning frequency by the indicia reading terminal of the user device is high or low and so on.

Alternatively, in other examples, the inputs 310, input 315 . . . input N may simply correspond to an end customer's requirements which are to be considered by a manufacturer of the user device for customizing BSP-chipset level parameters of chipsets provided by OEMs. The device customization system 300 may use any of the operations described herein with respect to adjustment of BSP-chipset level parameters in real-time for receiving such inputs and generating an output. Illustratively, in some other embodiments, such as when the circuitry 100 is embodied in a server and/or user device, the device customization system 300 may be located in another circuitry 100 or another device, such as another server and/or other user devices.

The device customization system 300 can be configured to access data corresponding to one or more users and environments, and generate one or more outputs. In this regard, the device customization system 300 may receive various inputs related to the operating conditions of the environment, such as background noise etc. as described above and may determine outputs such as adjustment of BSP-chipset level parameters of the user device.

With reference to FIG. 3, whether used locally or over a network, the device customization system 300 may be used to generate requested outputs per the pre-loaded conditions. The system may receive a plurality of inputs 310, 315 from the circuitry 100 and process the inputs within the device customization system 300 to produce an output 350. In some embodiments, the device customization system 300 may execute context determination module 320, process the data in an analytical engine 330, and modify one or more BSP-chipset level parameters through the BSP-chipset level modification module 340, resulting in an output 350 to the user (e.g., reduced beep volume, changed LED color, etc.). Each of these steps may pull data from a plurality of sources including the device customization database 200.

When inputs 310, 315 are received by the device customization system 300, a context determination using context determination module 320 may first be made. For instance, the context determination module 320 may analyze the inputs 310, input 315 . . . input N to determine a context or a sense of an operating environment in which the user device is to be operated. Illustratively, in an example, the inputs 310, 315 . . . input N may correspond to audio samples which are received from a microphone of the user device. In this regard, the context determination module 320 may determine a context such as indicative of acoustic environment identity, for example, a background noise intensity of the operating environment in which the user device is to be operated. Additionally, context determination may include such information as other customer data (e.g., what customer is associated with user device), company data (e.g., what company is associated with the input 310, 315), pre-loaded condition data (e.g., what pre-loaded conditions may be associated with the input 310, 315), background noise calibration data, whether a sensed condition or an audio recording sample was received as the input 310, 315, etc. These inputs may give context to the device customization system's 300 analysis to determine the output. For example, the context determination module 320 may inform the device customization system 300 as to what response is appropriate.

The device customization system 300 may then analyze the inputs 310, 315 using the analytical engine 330. In this regard, the analytical engine 330 may access the context such as indicative of the environment operating conditions or customer requirements depending on the environment in which the customer wants to operate the user device. Further, the analytical engine 330 may draw other information about the user/company/pre-loaded condition/background noise calibration etc. from the device customization database 200 and then, in light of the context determination module's 320 determination, computes an appropriate response. Illustratively, for the other information, the context determination module 320 may access pre-loaded condition data indicative of a profile for chipset parameters, such as chipset operational specifications or customized profiles.

Accordingly, the analytic engine 330 may process (a) the contextual information pertaining to operating conditions of the environment or customer requirements, from the context determination module 320 and (b) data pertaining to pre-created customized chipset profiles or pre-loaded conditions etc. to output a configuration or chipset specification, which is to be utilized, by a BSP-chipset level modification module 340, for providing output 350. Illustratively, in an example, the output of the analytic engine 330 may be XML files or application programming interface (APIs) indicative of settings, modes, or threshold values, indicating adjustments in BSP-chipset level parameters which influence operations of chipsets of the apparatus. Accordingly, the BSP-chipset level modification module 340 may modify or adjust chipset parameters based on the output of the analytics engine 330 and provide output 350. In this regard, the output 350 may be experienced by an end user or customer based on the customization or adjustments in BSP-chipset level parameters. For instance, the output 350 may be a screen brightness value adjusted based on lighting conditions in the operating environment of the user device. Alternatively, in another example, the output may be any of a LED blinking behavior or a scanner beep volume considered in configuration of the user device post adjustments in the chipset parameters.

As will be appreciated, any such computer program instructions and/or other type of code may be loaded onto a computer, processor or other programmable apparatus's circuitry to produce a machine, such that the computer, processor, or other programmable circuitry that execute the code on the machine create the means for implementing various functions, including those described herein.

It is also noted that all or some of the information presented by the examples discussed herein can be based on data that is received, generated and/or maintained by one or more components of a local or networked system and/or circuitry 100. In some embodiments, one or more external systems (such as a remote cloud computing and/or data storage system) may also be leveraged to provide at least some of the functionality discussed herein.

As described above and as will be appreciated based on this disclosure, embodiments of the present invention may be configured as methods, personal computers, servers, mobile devices, backend network devices, and the like. Accordingly, embodiments may comprise various means including entirely of hardware or any combination of software and hardware. Furthermore, embodiments may take the form of a computer program product on at least one non-transitory computer-readable storage medium having computer-readable program instructions (e.g., computer software) embodied in the storage medium. Any suitable computer-readable storage medium may be utilized including non-transitory hard disks, CD-ROMs, flash memory, optical storage devices, or magnetic storage devices.

Embodiments of the present invention have been described above with reference to block diagrams and flowchart illustrations of methods, apparatuses, systems and computer program goods. It will be understood that each block of the circuit diagrams and process flowcharts, and combinations of blocks in the circuit diagrams and process flowcharts, respectively, can be implemented by various means including computer program instructions. These computer program instructions may be loaded onto a general purpose computer, special purpose computer, or other programmable data processing apparatus, such as processor 110, device customization database 200, and/or device customization system 300 discussed above with reference to FIG. 1, to produce a machine, such that the computer program product includes the instructions which execute on the computer or other programmable data processing apparatus create a means for implementing the functions specified in the flowchart block or blocks.

These computer program instructions may also be stored in a computer-readable storage device (e.g., memory 120) that can direct a computer or other programmable data processing apparatus to function in a particular manner, such that the instructions stored in the computer-readable storage device produce an article of manufacture including computer-readable instructions for implementing the function discussed herein. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions discussed herein.

Accordingly, blocks of the block diagrams and flowchart illustrations support combinations of means for performing the specified functions, combinations of steps for performing the specified functions and program instruction means for performing the specified functions. It will also be understood that each block of the circuit diagrams and process flowcharts, and combinations of blocks in the circuit diagrams and process flowcharts, can be implemented by special purpose hardware-based computer systems that perform the specified functions or steps, or combinations of special purpose hardware and computer instructions.

The user device may include one or more input devices, including but not limited to a keyboard, a number pad, a mouse, a touch-sensitive display, a navigation key, a function key, a microphone, a voice recognition component, any other mechanism capable of receiving an input from a user, or any combination thereof. Further, the user device may include one or more output devices, including but not limited to a display, a speaker, a haptic feedback mechanism, a printer, lights, any other mechanism capable of presenting an output to a user, or any combination thereof.

The user device may include components for monitoring and/or collecting information regarding the user or external environment in which the component is placed. For instance, the user devices may include one or more sensors, scanners, microphones, and/or other monitoring components. In some embodiments, scanners may be used to determine the presence of certain individuals or items. For example, in some embodiments, the components may include a scanner, such as an optical scanner, RFID scanner, and/or other scanner configured to read human and/or machine readable indicia physically associated with an item. The user device may include one or more of an accelerometer, scanner, global positioning system, WiFi, Wan, proximity sensor, light sensor, the like, or combinations thereof.

Figure 4:
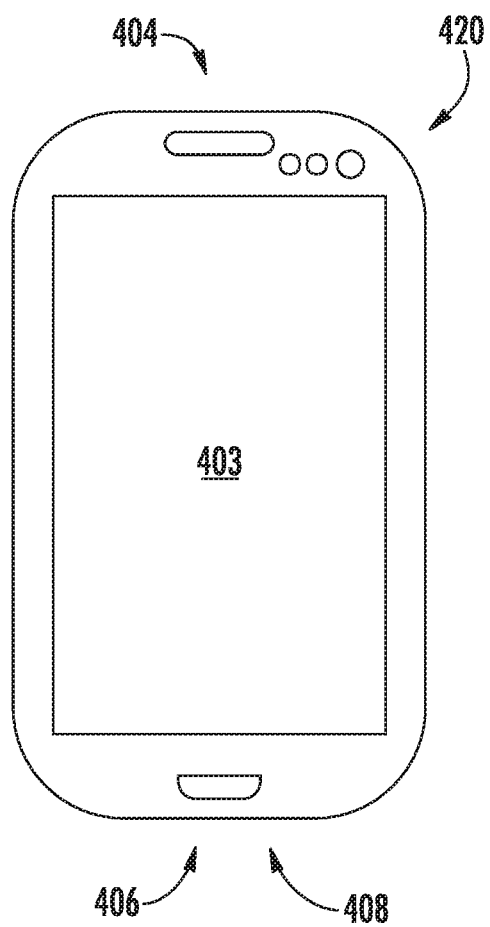
FIG. 4 illustrates an exemplary user device according to an example embodiment.

FIG. 4 illustrates an exemplary user device according to an example embodiment. In the embodiment illustrated in FIG. 4, the user device is a handset 404 (e.g., a mobile device or tablet device). The handset 404 may include one or more components of circuitry 100 as explained with regards to FIG. 1 and may include one or more other components (e.g., voice templates, speech encoders, etc.). The handset 404 may include one or more microphones 406 and one or more speakers 408, which may be connected to a set of headphones. The handset 404 can also include one or more antenna. The microphone 406 receives audio recording samples and transmits the received audio recording samples to one or more components of circuitry 100 in the handset 404. The speakers 408 may receive an audio transmission from one or more components of circuitry 100 in the handset 404 and output the audio transmission in the form of speech or sound. In an embodiment, the speakers 408 can also include noise cancellation. The handset 404 may connect with one or more other user devices and/or server. For instance, in some embodiments, the handset 404 may connect to a wireless headphone via a Bluetooth connection, where the wireless headphone includes a microphone and speaker for receiving audio recording samples and outputting speech or sound. The handset 404 can also include a user input device and output device (such as the display 403 forming an interface) to send and receive additional non-auditory information from circuitry 100, whether incorporated into the handset 404 or in other user devices and/or server. The display 403 of FIG. 4 may be a backlit LCD or OLED display. With the use of a handset 404 having one or more microphones 406 and one or more speakers 408, a user can communicate with a central server and/or with other user devices.

Although FIG. 4 illustrates one example of a handheld device, various changes may be made to FIG. 4. For example, all or portions of FIG. 4 may represent or be included in other handheld devices. Also, the functional division shown in FIG. 4 is for illustration only. Various components could be combined, subdivided, or omitted and additional components could be added according to particular needs.

The user device shown in FIG. 4 may include one or more sensors 620 for collecting sensed conditions. The one or more sensors 620 may include one or more of an accelerometer, scanner, global positioning system, WiFi, Wan, proximity sensor, light sensor, the like, or combinations thereof. The sensed conditions may be used to determine the pre-loaded condition along with a background noise intensity.

Figure 5:
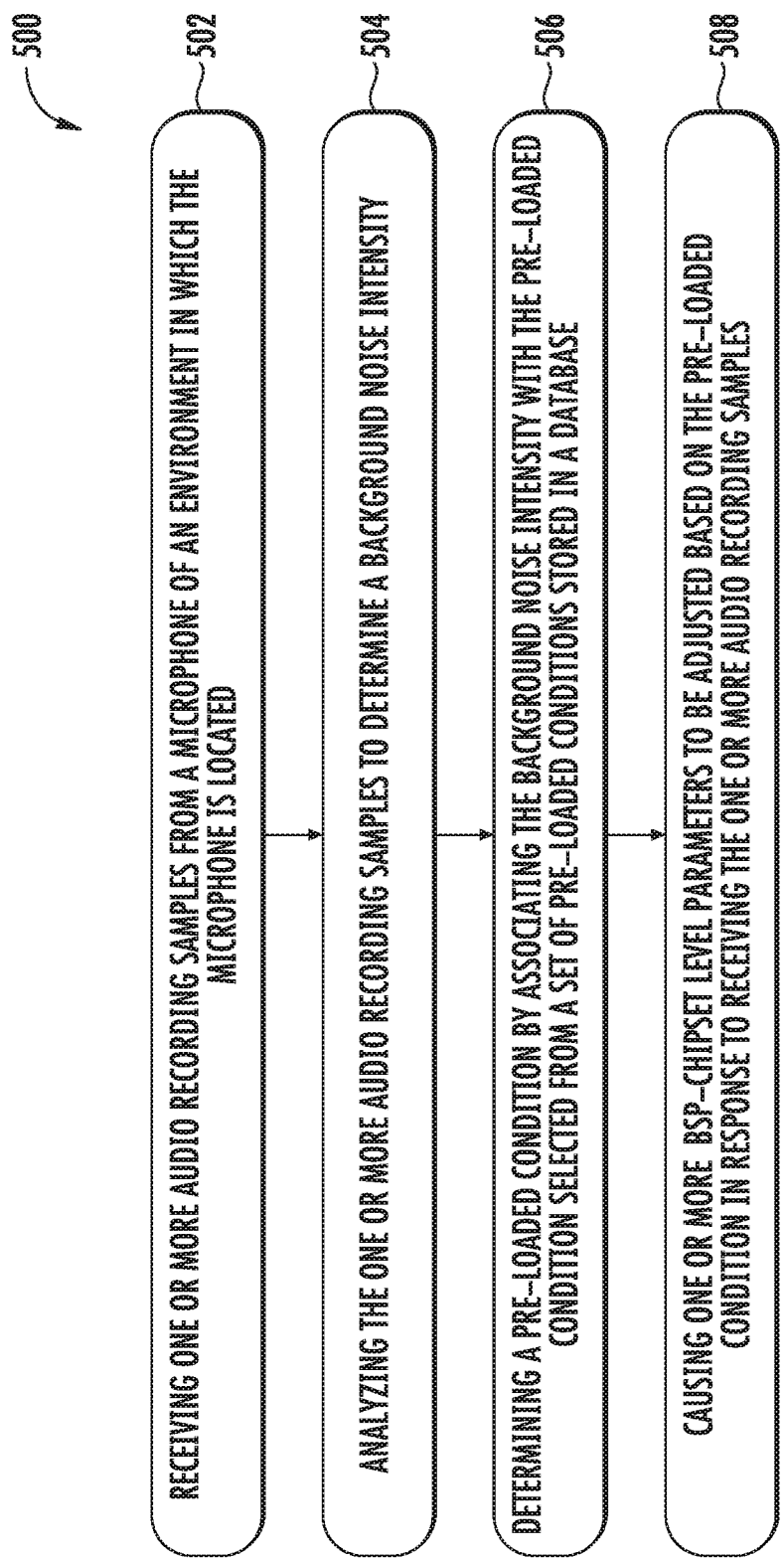
FIG. 5 illustrates a flowchart describing example operations performed by a user device, in accordance with an example embodiment described herein.
Figure 6:
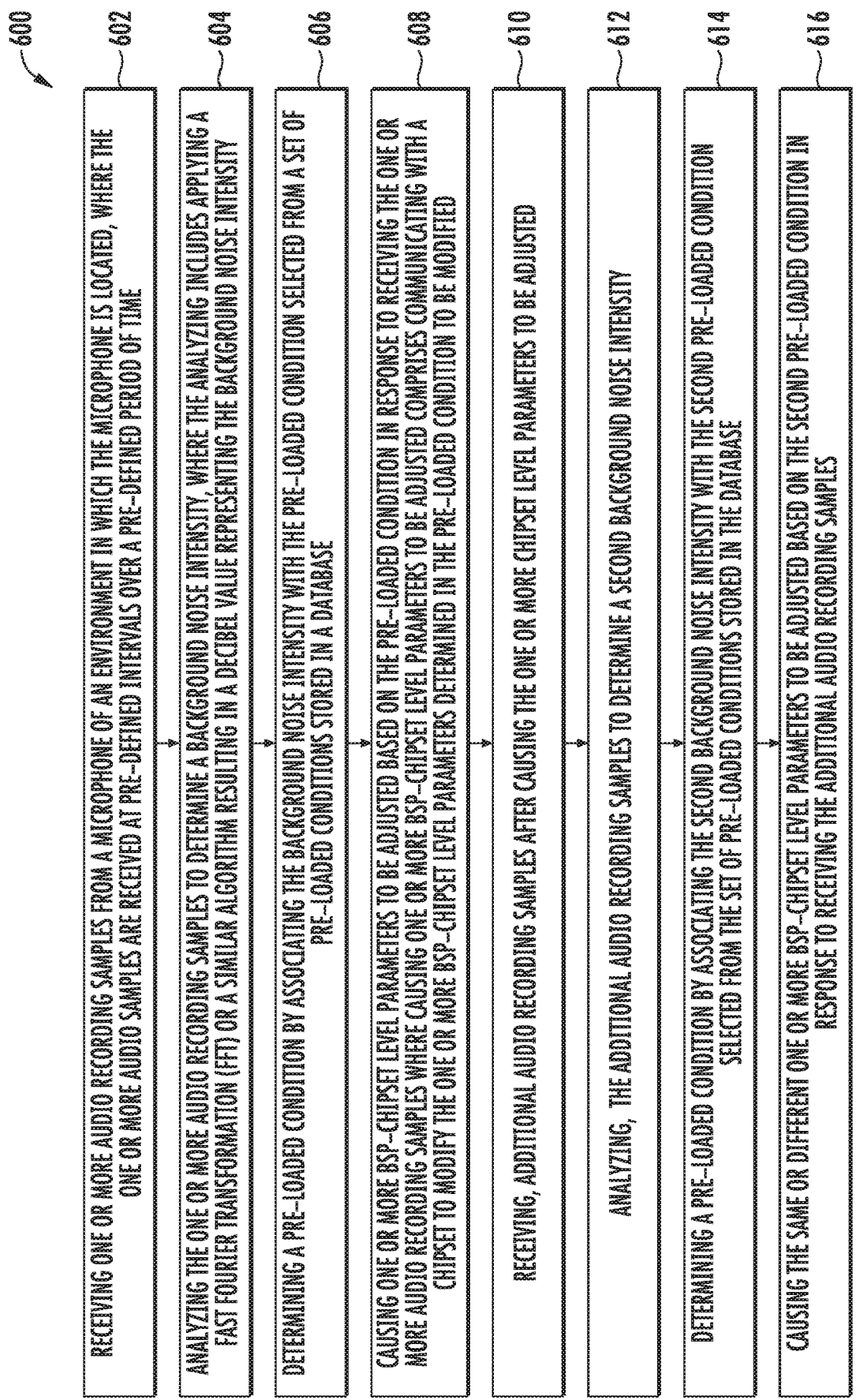
FIG. 6 illustrates a flowchart describing example operations performed by a user device, in accordance with another example embodiment described herein.

FIGS. 5-6 illustrate example flowcharts of the operations performed by an apparatus, such as a user device, in accordance with example embodiments of the present invention. It will be understood that each block of the flowcharts, and combinations of blocks in the flowcharts, may be implemented by various means, such as hardware, firmware, one or more processors, circuitry and/or other devices associated with execution of software including one or more computer program instructions. For example, one or more of the procedures described above may be embodied by computer program instructions. In this regard, the computer program instructions which embody the procedures described above may be stored by a memory of an apparatus employing an embodiment of the present invention and executed by a processor in the apparatus. As will be appreciated, any such computer program instructions may be loaded onto a computer or other programmable apparatus (e.g., hardware) to produce a machine, such that the resulting computer or other programmable apparatus provides for implementation of the functions specified in the flowcharts' block(s). These computer program instructions may also be stored in a non-transitory computer-readable storage memory that may direct a computer or other programmable apparatus to function in a particular manner, such that the instructions stored in the computer-readable storage memory produce an article of manufacture, the execution of which implements the function specified in the flowcharts' block(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowcharts' block(s). As such, the operations of FIGS. 5-6 when executed, convert a computer or processing circuitry into a particular machine configured to perform an example embodiment of the present invention. Accordingly, the operations of FIGS. 5-6 define an algorithm for configuring a computer or processor, to perform an example embodiment. In some cases, a general purpose computer may be provided with an instance of the processor which performs the algorithm of FIGS. 5-6 to transform the general purpose computer into a particular machine configured to perform an example embodiment.

Accordingly, blocks of the flowchart support combinations of means for performing the specified functions and combinations of operations for performing the specified functions. It will also be understood that one or more blocks of the flowcharts', and combinations of blocks in the flowchart, can be implemented by special purpose hardware-based computer systems which perform the specified functions, or combinations of special purpose hardware and computer instructions.

FIG. 5 illustrates an exemplary embodiment of a method 500 illustrating operations performed for customizing user devices, such as ones described previously in reference to FIGS. 1-6. In this regard, in an embodiment, various operations illustrated in reference to FIG. 5 may, for example, be performed by, with the assistance of, and/or under the control of circuitry 100 embodying a processor 110, a device customization database 200 and more particularly a device customization system 300.

Turning to operation 502, the processor 110 and/or device customization system 300 may receive audio recording samples from a microphone. In this regard, the microphone may be located within the apparatus or may be located external the apparatus such that a remote device including the microphone is communicatively coupled to the processor 110 and/or device customization system 300 via the communications module 140. Accordingly, the audio recording samples may pertain to an environment in which the microphone and/or the apparatus is located in. For example, in a situation it may so happen that the user device is utilized in a warehouse or an inventory for various tasks, such as picking and placements of commodities at various locations within the warehouse. In such situations, an operator within the warehouse may receive voice commands on a headset coupled to the user device and may accordingly respond to the voice commands indicating locations like shelf number, aisle number, or a bin number where he may have placed a product. Thus, in such scenarios, the audio recording samples may comprise the voice responses of the operator and any other additional noise in the background. The audio recording samples may be indicative of an identity of the environment. For example, based on the analysis of the audio samples, including for example, the operator's voice responses and warehouse background noise, the environment in which a customer is using the user device may be identified.

In some embodiments, the processor 110 may receive other parameters that are indicative of the environment. For example, the processor 100 may receive inputs pertaining to any of location values received via a GPS unit, indicia scanned by indicia reading terminal, a Wi-fi network profile, and any other operating environment parameter sensed by the user device.

Turning to operation 504, determination of background noise intensity from the received one or more audio recording samples may be performed. In this regard, the processor 110 and/or device customization system 300 may analyze the one or more audio recording samples to determine a background noise intensity. In this regard, as illustrated, referring to the description of FIG. 3, a context determination module 320 may access via the processor 110, inputs 310, input 315 . . . input N corresponding to the recorded audio samples and may analyze the audio recording samples to identify a context, such as background noise intensity of the environment. Illustratively, the determined background noise intensity may be utilized by the processor 110 and/or device customization system 300 further for adjusting BSP-chipset level parameters. The processor 110 and/or device customization system 300 may also calibrate the microphone based on the received one or more audio recording samples.

Turning to operation 506, the processor 110 and/or the device customization system 300 may determine a pre-loaded condition by associating the determined background noise intensity with the pre-loaded condition selected from multiple pre-loaded conditions stored in a database, such as, device customization database 200. In this regard, as illustrated in FIG. 3, an analysis engine 330 of the device customization system 300 may retrieve from the device customization database 200, specifically, pre-loaded condition data 213. Illustratively, the analysis engine 330 may access (a) a context, like a background noise identity identified by the context determination module 320 and (b) data from the device customization database 200, such as pre-loaded conditions, and may associate the context with one of the pre-loaded condition selected from amongst multiple pre-loaded conditions retrieved from the database 200. Accordingly, the analysis engine 330 determines the selected pre-loaded condition to be one that is to be considered for adjusting the BSP-chipset level parameters.

Turning to operation 508, the processor 110 and/or the device customization system 300 may cause one or more BSP-chipset level parameters to be adjusted based on the determined pre-loaded condition, i.e., the pre-loaded condition selected from amongst multiple pre-loaded conditions stored in the database 200. In this regard, as illustrated in FIG. 3, a BSP-chipset level modification module 340 of the device customization system 300 may access the selected or determined pre-loaded condition and cause adjustments or modifications in BSP-chipset level parameters based on a communication with a respective chipset of the user device. Illustratively, in an example, the communication may correspond to one or more application programming interfaces (APIs) communicating with an operating system (OS) of the user device, which triggers at least one system call for driving operations of the chipset. In this regard, based on the communication, modifications may be performed on the BSP-chipset level parameters depending on selected pre-loaded conditions depending on the operating environment, for instance, conditions may be specified in XML files having modified chipset parameters plumed with other chipset data including modes, thresholds, or attributes which influence operations of the chipset. The BSP-chipset level parameters may be modified using the XML files.

FIG. 6 illustrates an exemplary embodiment of a method 600 for adjusting BSP-chipset level parameters in real time response to changes in a user device or an environment in which the user device is located. Illustratively, as per various embodiments described herein, the user devices may be such as ones described previously in reference to FIGS. 1-6. In this regard, in an embodiment, various operations illustrated in reference to FIG. 6 may, for example, be performed by, with the assistance of, and/or under the control of an apparatus embodying a processor 110, a device customization database 200, and more particularly a device customization system 300.

Turning to operation 602, the processor 110 and/or the device customization system 300 may receive audio recording samples from a microphone of an environment in which the microphone may be located. Illustratively, in an example, the microphone may be located in same environment as of the user device. In this regard, the processor 110 and/or the device customization system 300 may receive the audio recording samples at pre-defined intervals over a pre-defined period of time. For instance, in some situations, although the microphone may continuously measure sound signals while acoustic recording, the processor 110 and/or the device customization system 300 may only periodically access such audio recording samples, for example after pre-defined intervals of time. In this regard, in an example, the time intervals may be pre-defined based on a type of chipset or a default chipset configuration, or a chipset specification considered while calibrating a microphone of the user device.

Turning to operation 604, the processor 110 and/or the device customization system 300 may analyze the one or more audio recording samples to determine a background noise intensity. In this regard, the background noise intensity may be a value in decibels indicative of noise level in an environment where the user device is to be operated. Alternatively, in another example, the background noise intensity may be indicative of a noise within the user device itself, for instance, noise caused by a device hardware itself. In this regard, in an embodiment, the determination of the background noise intensity may be performed by the processor 110 and/or the device customization system 300. In this regard, one or more inputs, such as input 310, 315 . . . input N illustrated in FIG. 3, may correspond to the audio recording samples collected by the microphone, which further, may be accessed by a context determination module 320. Illustratively, in such situations, the context determination module 320 may determine the background noise intensity based on applying a Fast Fourier Transformation (FFT) or a similar algorithm on received audio recording samples. The background noise intensity may correspond to a context of an environment operation conditions, such as noise level, determined by the context determination module 320.

Illustratively, for determining background noise intensity based on the FFT, the recorded audio samples may be converted into a frequency domain. In this regard, the audio recording samples may comprise portions of speech and portions of noise. A signal to noise ratio (SNR) may be resulted based on applying FFT on the audio samples. Accordingly, portions of noise may be identified by filtering out frequencies corresponding to the noise from the audio recording samples converted in the frequency domain based on FFT. In this regard, the portions of noise may be processed to determine the background noise intensity indicating a decibel value of noise. Illustratively, the background noise intensity may be classified into high, medium, low, or none depending on a level of the noise identified in the environment or in the user device. In an example embodiment, the processor 110 and/or the device customization system 300 may calibrate the microphone to collect background noise by collecting audio recording samples in an environment with a low, medium, or high background noise intensity. Alternatively, any other conventionally known technique may be utilized for determining background noise intensity from audio samples recorded by the microphone.

Turning to operation 606, the processor 110 and/or the device customization system 300 may determine a pre-loaded condition based on the background noise intensity determined as an outcome of operation 604. In this regard, in an embodiment, as illustrated in FIG. 3, an analytic engine 330 of the device customization system 300 may access the background noise intensity determined by the context determination module 320 and may associate it with one or more pre-loaded conditions. Illustratively, in an embodiment, the one or more pre-loaded conditions may be accessible via the device customization database 200 as illustrated in FIG. 2. In this regard, the analytical engine 330 may perform a matching operation such as, one to select a pre-loaded condition from amongst multiple pre-loaded conditions stored in the device customization database 200. While performing the matching operation, the analytical engine 330 may check that for the determined background noise intensity which the pre-loaded condition is best matched or suited for consideration. In this regard, as described previously, the pre-loaded conditions may include conditions to be considered for performing adjustments on BSP-chipset level parameters. For example, the pre-loaded conditions may correspond to chipset customization profiles, pre-created or loaded into a database by a device manufacturer. In this regard, post purchasing original chipset from an OEM, the device manufacturer depending on (a) customer requirements and/or (b) operating conditions of environment in which the end customer wants to deploy or utilize the user device, prepare chipset customization profiles which may be readily utilized by the processor 110 and/or the device customization system 300 for self-customizing or modifying chipset performance in the user devices.

Turning to operation 608, the processor 110 and/or the device customization system 300 may cause one or more BSP-chipset level parameters to be adjusted. In this regard, the processor 110 and/or the device customization system 300 may communicate with a chipset for modifying one or more BSP-chipset level parameters. Illustratively, the BSP-chipset level parameters may be modified depending on conditions specified in the pre-loaded condition. For instance, in an example embodiment, the conditions may specify a gain adjustment in speakers of the user device, if the determined background intensity outside (e.g., above or below) a threshold defined as per a chipset specification. Alternatively, in another example embodiment, the conditions may specify a hardware noise cancellation to be turned on a microphone associated with the user device, when the determined background noise intensity is high. In another example embodiment, the conditions may specify a LED light of the user device not to blink based on conditions of the environment determined by the processor 110 and/or device customization system 300.

Illustratively, but not limited to, the BSP-chipset level parameters that may be adjusted depending on the pre-loaded condition may be at least one of a screen brightness, LED blinking behavior, LED color, speaker volume, microphone gain, noise cancellation, echo cancellation, battery performance, keypad mapping, touch screen calibration, Wi-Fi profile, WWAN carrier selection, scanner beep volume, the like, or combinations thereof.

Turning to operation 610, upon causing adjustment of BSP-chipset level parameters, additional audio recording samples may be received by the processor 110 and/or the device customization system 300. In this regard, the processor 110 and/or the device customization system 300 may receive the additional audio recording samples, for example after passage of a pre-defined period of time following adjustment of the BSP-chipset level parameters. This may happen in situations when periodic or frequent calibration or customization of the user device is desired by customers. Additionally, this may also occur in situations when the user device is in motion frequently or environment conditions in which the user device is to be operated change repeatedly. In this regard, in accordance with embodiments illustrated in FIG. 3, for situations in which the audio recording samples corresponds to inputs 310, 314 . . . input N, the context determination module 320 may recursively or periodically access such additional audio recording samples.

Turning to operation 612, the additional audio recording samples are analyzed by the processor 110 and/or the device customization system 300, for instance, via the context determination module 320. Illustratively, the additional audio recording samples may be analyzed by the processor 110 and/or the device customization system 300 applying a FFT technique or any other similar technique described previously, to determine a second background intensity. In this regard, it may so happen that the determined second background intensity may be same or different from a first background noise intensity determined by the processor 110 and/or the device customization system 300. In this regard, as illustrated at operation 614, depending on a value of the second background noise intensity to be same or different from the previously determined background noise intensity, a second pre-loaded condition may be determined by the processor 110 and/or the device customization system 300. Accordingly, the second pre-loaded condition may be determined based on the second background noise intensity, in a similar manner as described with respect to operation 606.

Turning to operation 616, determination of the second pre-loaded condition may cause adjustments in the same or different BSP-chipset level parameters in response to receiving of the additional one or more audio recording samples. Illustratively, in an example, the second pre-loaded conditions may specify conditions for adjusting noise cancellation of components of the user device such as, earphones or a microphone, based on the second background noise intensity determined by the processor 110 and/or the device customization system 300. In this regard, the second pre-loaded condition may cause adjustment in the noise cancellation parameter of a chipset when the determined second background noise intensity is outside (e.g., above or below) a threshold level associated with the second pre-loaded condition.

In accordance with another embodiment, the processor 110 and/or the device customization system 300 may receive other sensed conditions, apart from and/or in addition to the one or more audio recording samples, as inputs 310, 315 . . . input N, by different components of the user device. For instance, in an example, the processor 110 and/or the device customization system 300 may receive a location, or a state of movement measured by a GPS unit of the user device. The processor 110 and/or the device customization system 300 may receive an indicia captured by an indicia reading unit of the user device. The processor 110 and/or the device customization system 300 may receive a proximity value measured by a proximity sensor of the user device and/or lighting condition values measured by a light sensor. In this regard, the processor 110 and/or device customization system 300 may analyze, all conditions such as, but not limited to, background noise intensity and/or other sensed conditions, received as inputs, to determine a pre-loaded condition that may be applicable such as, based on association of the analyzed conditions with the pre-loaded condition data 213 stored in a device customization database 200, as illustrated in FIG. 2. In this regard, the processor 110 and/or the device customization system 300 may accordingly select the determined pre-loaded condition, and then adjust one or more applicable BSP-chipset level parameters based on the pre-loaded condition. For example, in some situations, an LED blinking behavior parameter of the user device may be adjusted when analysis of the one or more sensed condition indicate that the user device is in a state of motion. Illustratively, in an embodiment, a combination of BSP-chipset level parameters including but not limited to, screen brightness, LED blinking behavior, LED color, speaker volume, microphone gain, noise cancellation, echo cancellation, battery performance, keypad mapping, touch screen calibration, Wi-Fi profile, WWAN carrier selection, or scanner beep volume, may be adjusted based on analysis of a combination of conditions, including but not limited to, background noise intensity, a current location of the user device monitored by a GPS, a state of motion of the user device monitored by an accelerometer of the user device, lightning conditions like ambient light level monitored by a light sensor of the user device and the like, by the processor 110 and/or the device customization system 300.

Accordingly, depending on various sensed conditions associated with an environment, user devices having OEM manufactured chipsets may be customized by modifying parameters at chipset level for an end customer. Customization of the user devices, according to various embodiments illustrated herein, may be performed automatically based on pre-customized profiles, such as pre-loaded conditions, in real time depending on at least one of a requirement received from an end customer and/or operating conditions for an environment type where the user device is to be or is being utilized.

In some example embodiments, certain ones of the operations herein may be modified or further amplified as described below. Moreover, in some embodiments additional optional operations may also be included. It should be appreciated that each of the modifications, optional additions or amplifications described herein may be included with the operations herein either alone or in combination with any others among the features described herein.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module (or processor-executable instructions) which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

In addition, the section headings used herein are provided for consistency with the suggestions under 37 C.F.R. 1.77 or to otherwise provide organizational cues. These headings shall not limit or characterize the invention(s) set out in any claims that may issue from this disclosure. For instance, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components may be used in conjunction with the supply management system. Therefore, it is to be understood that the inventions are not to be limited to the specific embodiments disclosed and that modifications and other embodiments are intended to be included within the scope of the appended claims. For example, the various elements or components may be combined or integrated in another system or certain features may be omitted or not implemented. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

The invention claimed is:

1. An apparatus configured to adjust board support package (BSP)-chipset level parameters in response to changes in the apparatus or an environment in which the apparatus is located, the apparatus comprising:
 a microphone configured to receive one or more audio recording samples of the environment in which the apparatus is located; and
 a processor in communication with the microphone, wherein the processor is configured to:
  receive the one or more audio recording samples from the microphone;
  analyze the one or more audio recording samples to determine a background noise intensity;
  determine a customization profile by associating the background noise intensity with a pre-loaded condition selected from a set of pre-loaded conditions stored in a database, wherein the pre-loaded condition comprises one or more values that define the customization profile including a predefined chipset configuration profile having a chipset specification defined in a XML file; and
  cause one or more BSP-chipset level parameters to be adjusted in real time by applying the chipset specification of the customization profile,
  wherein the one or more BSP-chipset level parameters include one or more operational parameters associated with at least one hardware unit or a chipset in a user device and accessible through a BSP,
  wherein causing the one or more BSP-chipset level parameters to be adjusted in real time by applying the chipset specification of the customization profile comprises adjusting operational parameters within a broader range than accessible on a user interface or adjusting operational parameters not accessible on the user interface.

2. The apparatus of claim 1, wherein the processor is further configured to cause the one or more BSP-chipset level parameters to be adjusted in real time based on the pre-loaded condition by communicating with the chipset to modify the one or more BSP-chipset level parameters using XML script associated with the one or more BSP-chipset level parameters.

3. The apparatus of claim 1, wherein the one or more BSP-chipset level parameters comprise at least one of the following: screen brightness, LED blinking behavior, LED color, speaker volume, microphone gain, noise cancellation, echo cancellation, battery performance, keypad mapping, touch screen calibration, a WiFi profile, WWAN carrier selection, or scanner beep volume.

4. The apparatus of claim 1, wherein the microphone is further configured to receive the one or more audio recording samples by collecting the one or more audio recording samples at pre-defined intervals over a pre-defined period of time.

5. The apparatus of claim 1, wherein the processor is further in communication with one or more sensors and configured to receive one or more sensed conditions from the one or more sensors by communicating with the one or more sensors.

6. The apparatus of claim 5, wherein the processor is further configured to associate the sensed conditions with the pre-loaded condition when determining the pre-loaded condition.

7. The apparatus of claim 5, wherein the one or more sensors comprise at least one of the following: an accelerometer, a gyroscope, a scanner, global positioning system, WiFi, Wan, a proximity sensor, an ambient light sensor, a digital compass, or a microphone.

8. The apparatus of claim 1, wherein the processor is further configured to analyze the one or more audio recording samples to determine the background noise intensity by applying a fast fourier transformation (FFT) algorithm or a similar algorithm, the FFT algorithm or the similar algorithm resulting in a decibel value representing the background noise intensity.

9. The apparatus of claim 1, wherein the processor is further configured to:
 receive additional audio recording samples of the environment in which the apparatus is located after causing the one or more BSP-chipset level parameters to be adjusted;
 analyze the additional audio recording samples to determine a second background noise intensity;
 determine a second pre-loaded condition by associating the second background noise intensity with the second pre-loaded condition selected from the set of pre-loaded conditions stored in the database; and
 cause the same or different one or more BSP-chipset level parameters to be adjusted in real time based on the second pre-loaded condition in response to receiving the additional audio recording samples.

10. The apparatus of claim 9, wherein the processor is further configured to receive the additional audio recording samples after a pre-defined period of time has passed since the processor caused the one or more BSP-chipset level parameters to be adjusted in real time based on the pre-loaded condition by monitoring a time delay after the one or more BSP-chipset level parameters.

11. The apparatus of claim 1, wherein the one or more BSP-chipset level parameters comprise a noise cancellation parameter and the noise cancellation parameter is caused to be adjusted in real time when the background noise intensity is determined to be outside a threshold level associated with the pre-loaded condition.

12. The apparatus of claim 7, wherein the one or more BSP-chipset level parameters comprise a LED blinking behavior parameter and the LED blinking behavior parameter is caused to be adjusted in real time when the one or more sensed conditions indicate the apparatus is in motion.

13. The apparatus of claim 1, wherein the processor is further configured to calibrate the microphone to collect background noise by collecting the audio recording samples in an environment with a low background noise intensity.

14. A method of adjusting board support package (BSP)-chipset level parameters in response to changes in an environment in which a microphone is located, the method comprising:
- receiving one or more audio recording samples from the microphone of the environment in which the microphone is located;
- analyzing the one or more audio recording samples to determine a background noise intensity;
- determining a customization profile by associating the background noise intensity with a pre-loaded condition selected from a set of pre-loaded conditions stored in a database, wherein the pre-loaded condition comprises one or more values that define the customization profile including a predefined chipset configuration profile having a chipset specification defined in a XML file; and
- causing one or more BSP-chipset level parameters to be adjusted in real time by applying the chipset specification of the customization profile,
- wherein the one or more BSP-chipset level parameters include one or more operational parameters associated with at least one hardware unit or a chipset in a user device and accessible through a BSP,
- wherein causing the one or more BSP-chipset level parameters to be adjusted in real time by applying the chipset specification of the customization profile comprises adjusting operational parameters within a broader range than accessible on a user interface or adjusting operational parameters not accessible on the user interface.

15. The method of claim 14, wherein causing the one or more BSP-chipset level parameters to be adjusted in real time based on the pre-loaded condition comprises communicating with the chipset to modify the one or more BSP-chipset level parameters.

16. The method of claim 14, wherein the one or more BSP-chipset level parameters comprise at least one of the following: screen brightness, LED blinking behavior, LED color, speaker volume, microphone gain, noise cancellation, echo cancellation, battery performance, keypad mapping, touch screen calibration, a WiFi profile, WWAN carrier selection, or scanner beep volume.

17. The method of claim 14, wherein receiving the one or more audio recording samples from the microphone comprises receiving the one or more audio recording samples at pre-defined intervals over a pre-defined period of time.

18. The method of claim 14, further comprising receiving one or more sensed conditions from one or more sensors by communicating with the one or more sensors.

19. The method of claim 18, further comprising associating the one or more sensed conditions with the pre-loaded condition when determining the pre-loaded condition.

20. The method of claim 18, wherein the one or more sensors comprise at least one of the following: an accelerometer, a scanner, global positioning system, WiFi, Wan, a proximity sensor, or a light sensor.

21. The method of claim 14, wherein analyzing the one or more audio recording samples to determine the background noise intensity comprises applying a fast fourier transformation (FFT) algorithm or a similar algorithm, the FFT algorithm or the similar algorithm resulting in a decibel value representing the background noise intensity.

22. The method of claim 14, further comprising:
- receiving additional audio recording samples after causing the one or more BSP-chipset level parameters to be adjusted;
- analyzing the additional audio recording samples to determine a second background noise intensity;
- determining a second pre-loaded condition by associating the second background noise intensity with the second pre-loaded condition selected from the set of pre-loaded conditions stored in the database; and
- causing the same or different one or more BSP-chipset level parameters to be adjusted in real time based on the second pre-loaded condition in response to receiving the additional audio recording samples.

23. The method of claim 22, wherein receiving the additional audio recording samples occurs after a pre-defined period of time has passed since causing the one or more BSP-chipset level parameters to be adjusted in real time based on the pre-loaded condition.

24. The method of claim 14, wherein the one or more BSP-chipset level parameters comprise a noise cancellation parameter and the noise cancellation parameter is adjusted in real time when the background noise intensity is determined to be outside a threshold level associated with the pre-loaded condition.

25. The method of claim 18, wherein the one or more BSP-chipset level parameters comprise a LED blinking behavior parameter and the LED blinking behavior parameter is adjusted in real time when the one or more sensed conditions indicate the apparatus is in motion.

* * * * *